(12) United States Patent
Muramatsu

(10) Patent No.: US 6,756,864 B2
(45) Date of Patent: Jun. 29, 2004

(54) BRANCHING FILTER AND COMMUNICATION APPARATUS

(75) Inventor: Kiyoshige Muramatsu, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/272,907

(22) Filed: Oct. 18, 2002

(65) Prior Publication Data

US 2003/0090338 A1 May 15, 2003

(30) Foreign Application Priority Data

Oct. 19, 2001 (JP) ........................................ 2001-322384
Sep. 4, 2002 (JP) ........................................ 2002-259008

(51) Int. Cl.⁷ .............................. H03H 9/72; H03H 9/64
(52) U.S. Cl. ........................................ 333/133; 333/193
(58) Field of Search ........................... 333/133, 193–196

(56) References Cited

U.S. PATENT DOCUMENTS 6,489,860 B1 * 12/2002 Ohashi ........................ 333/133
6,489,861 B2 * 12/2002 Noguchi et al. ............. 333/133

FOREIGN PATENT DOCUMENTS

| JP | 06-090128 | 3/1994 |
| JP | 6-350307 | * 12/1994 |
| JP | 09-098046 | 4/1997 |
| JP | 11-205077 | * 7/1999 |

OTHER PUBLICATIONS

"Transistor Gijutsu" (Transistor Technology), CQ Publishing Co., Ltd; pp. 405–409; Jun., 1987.

* cited by examiner

*Primary Examiner*—Barbara Summons
(74) *Attorney, Agent, or Firm*—Keating & Bennett, LLP

(57) ABSTRACT

A branching filter includes a receiving surface acoustic wave filter and a transmitting surface acoustic wave filter, which are provided on a multilayer ceramic substrate. The branching filter further includes at least one matching element and a low pass filter, which are provided within the multilayer ceramic substrate. The matching element is connected to the receiving surface acoustic wave filter and the low pass filter is connected to the transmitting surface acoustic wave filter. The ground of the low pass filter is separated within the multilayer ceramic substrate from the grounds of the other circuit.

15 Claims, 21 Drawing Sheets

BRANCHING FILTER AND COMMUNICATION APPARATUS

BACKGROUND OF THE INVENTION

1. Field of the Invention

The present invention relates to a branching filter in which surface acoustic wave filters are arranged on a multilayer ceramic substrate, which defines a package, and to a communication apparatus including such a branching filter.

2. Description of the Related Art

A branching filter is an electrical component that is connected between an antenna and a transmitting power amplifier in a portable telephone or other suitable apparatus. Since the branching filter can be increasingly miniaturized as the passband thereof becomes higher, a branching filter using a surface acoustic wave (SAW) filter is known. The branching filter requires a transmitting-side spurious characteristic, i.e., a capability of removing second and third harmonic signals, which are unwanted signals generated by a power amplifier, and the demand for this requirement is increasingly stronger.

Under this circumstance, in order to improve the spurious characteristic, some inventions have been proposed in which a filter that is constituted by LC elements is connected to a transmitting SAW filter for use in a branching filter. Examples include a duplexer disclosed in Japanese Unexamined Patent Application Publication No. H6-90128 (patent document 1) and a branching filter disclosed in Japanese Unexamined Patent Application Publication No. H9-98046 (patent document 2).

Meanwhile, an approach that is commonly used for realizing a high-frequency analog circuit is discussed in "Transistor Gijutsu" (Transistor Technology), June 1987, (CQ Publishing Co. Ltd.; non-patent document 1). In this approach, a ground layer that is called a "ground plane" having a large area and stable potential is provided in a circuit and the grounds of circuit elements are all connected to the ground plane.

This approach holds true for the case of branching filters and is commonly applied to branching filters. Thus, the grounds of SAW filters, a matching filter, and a filter constituted by LC elements are connected to a ground layer provided within a multilayer ceramic substrate.

Patent Document 1: Japanese Unexamined Patent Application Publication No. H6-90128 (Data of Publication; Mar. 29, 1994)

Patent Document 2: Japanese Unexamined Patent Application Publication No. H9-98046 (Data of Publication; Apr. 8, 1997)

Non-Patent Document 1: Transistor Gijutsu, Jun. 1987 issue

Conventionally, for an improvement in transmitting a side spurious characteristic, optimum design conditions are determined by adjusting the characteristics of SAW filters, a matching element, and a filter constituted by LC elements.

When a further improvement is necessary, however, in reality, an approach by which characteristics in the passband of a transmitting SAW filter or a receiving SAW filter are sacrificed must be taken, which leads to a problem in that an improvement in the transmitting-side spurious characteristic is limited.

For improving the spurious characteristic, the following two possible approaches have been available. The first approach is to improve the spurious characteristic by increasing a capacitance ratio, i.e., the ratio of the motional capacitance to the shunt capacitance of the IDT in the transmitting SAW filter. With this approach, however, naturally, the passband characteristic of the transmitting SAW filter is also affected. To achieve impedance matching in the passband, it is also necessary to ensure that the capacitance ratio is within a certain range, and to increase the capacitance ratio, however, causes the passband to become capacitive, thus adversely affecting the VSWR loss. The second approach is to increase the attenuation in second and third harmonics by increasing the shunt capacitance of a low pass filter. With this approach, however, the gain of the low pass filter is deteriorated in the passband of a transmitting SAW filter, thereby resulting in increased loss in the transmitting SAW filter.

SUMMARY OF THE INVENTION

In order to overcome the problems described above, preferred embodiments of the present invention provide a branching filter that significantly improves a transmitting-side spurious characteristic and a communication apparatus including such a novel branching filter.

According to a first preferred embodiment of the present invention, a branching filter includes a receiving SAW filter, a transmitting SAW filter, and at least one matching element connected to the receiving SAW filter. The branching filter further includes a filter having at least one of an inductance element and a capacitance element. The filter is also connected to the transmitting SAW filter. The ground of the filter is provided separately from the grounds of the other circuit elements.

With this arrangement, since the branching filter includes the receiving SAW filter, the transmitting SAW filter, and the at least one matching element connected to the receiving SAW filter, the branching filter according to the first preferred embodiment of the present invention can have a branching-filter function. Additionally, since the ground of the filter having at least one of an inductance element and a capacitance element is provided separately from the grounds of the other circuit elements, this branching filter greatly improves the transmitting-side spurious characteristic without deteriorating the in-band characteristics of the transmitting SAW filter or the receiving SAW filter.

In addition, since the branching filter includes the filter connected to the transmitting SAW filter, this arrangement significantly improves the transmitting-side spurious characteristic. Furthermore, completely separating the ground of the filter from the grounds of the other circuit elements and providing an external terminal that is used only for the ground of the filter further improves the transmitting-side spurious characteristic.

As a result, with this arrangement, it is possible to provide a branching filter having an improved transmitting-side spurious characteristic without affecting the receiving- and transmitting-side band characteristics.

Preferably, the filter having at least one of an inductance element and a capacitance element is a low pass filter having a π-type circuit. In the π-type circuit, capacitance elements are connected to corresponding opposite ends of inductance elements, the inductance elements are connected in series with each other, and the capacitance elements are each connected to ground, and another capacitance element is connected in parallel with the inductance elements.

Alternatively, the filter having at least one of an inductance element and a capacitance element may be a low pass filter including two inductance elements that are connected in series with each other, a series circuit in which a capacitance element and an inductance element are connected in series with each other, and one end of the series circuit is connected between the two inductance elements.

When the low pass filter having one of the above-described configurations is used, the low pass filter can be configured to have a ripple in the filter characteristic, and matching the ripple to the passband of the transmitting SAW filter so as to prevent deterioration in the bandpass characteristic of the transmitting SAW filter.

Preferably, the receiving SAW filter and the transmitting SAW filter are provided on a ceramic substrate. With this arrangement, it is possible to provide a branching filter that is superior in robustness and that is very easy to handle.

Preferably, the ceramic substrate has a multilayer structure. With this arrangement, the matching element and the filter, which may be the low pass filter, can be provided within the multilayer substrate, thereby allowing for miniaturization of the branching filter.

Preferably, the filter, which may be the low pass filter, is provided within the multilayer ceramic substrate. This arrangement can make it easier to manufacture the branching filter than in the case in which the filter is externally provided. In addition, the transmitting SAW filter and the filter, which may be the low pass filter, can be arranged in close proximity to each other, thereby contributing to an improvement in the transmitting-side spurious characteristic.

Preferably, the ground of the receiving SAW filter and the ground of the transmitting SAW filter are separated from each other.

Another preferred embodiment of the present invention provides a communication apparatus including the branching filter described above. Since the communication apparatus according to this preferred embodiment of the present invention has a branching filter with an improved transmitting-side spurious characteristic, the communication characteristic is greatly improved.

Other features, elements, characteristics and advantages of the present invention will become more apparent from the following detailed description of preferred embodiments of the present invention.

DETAILED DESCRIPTION OF PREFERRED EMBODIMENTS

A branching filter according to the present invention will be described below in conjunction with preferred embodiments thereof with reference to FIGS. 1 to 20.

Figure 1:
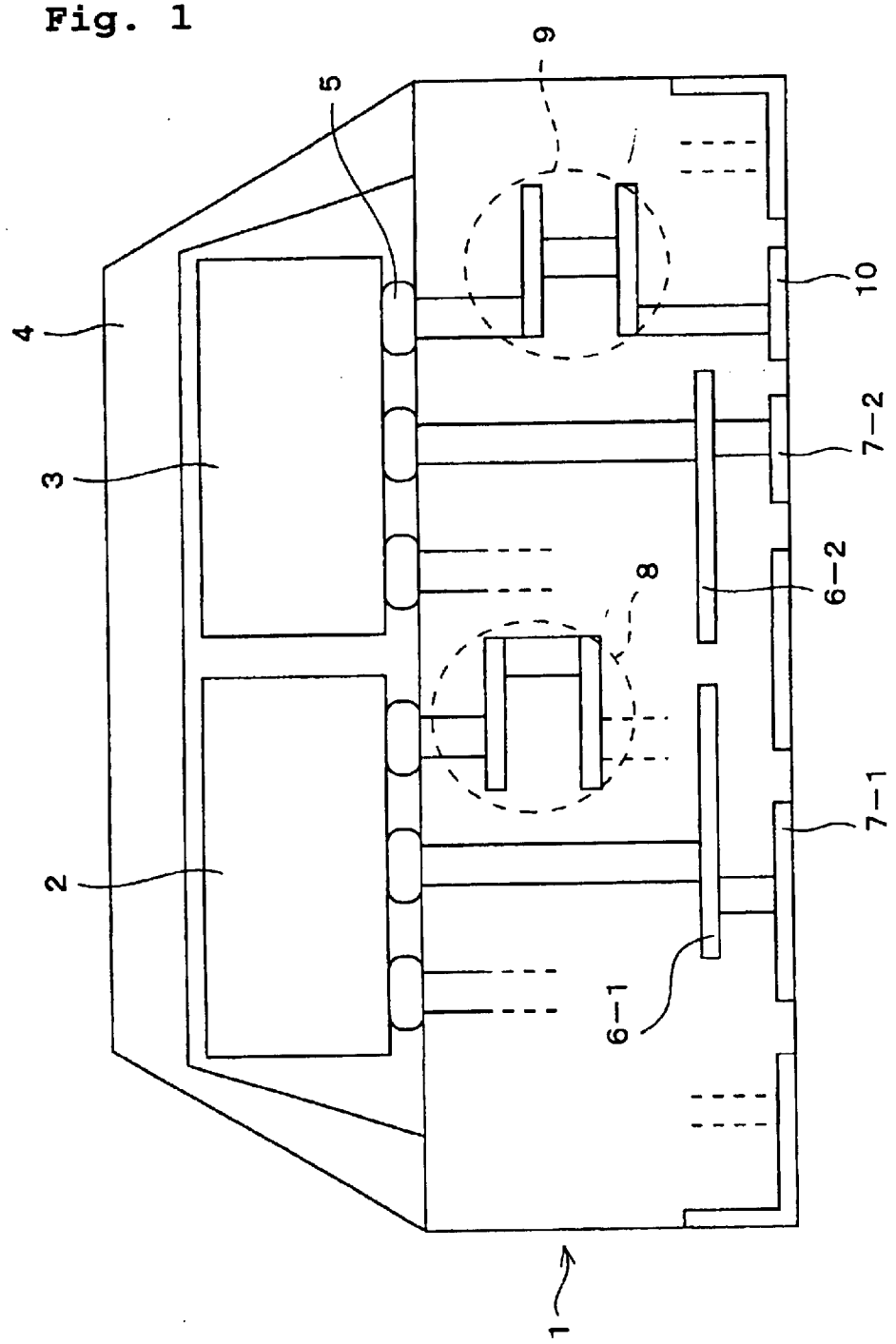
FIG. 1 is a schematic sectional view of a branching filter according to a first preferred embodiment of the present invention.
Figure 2:
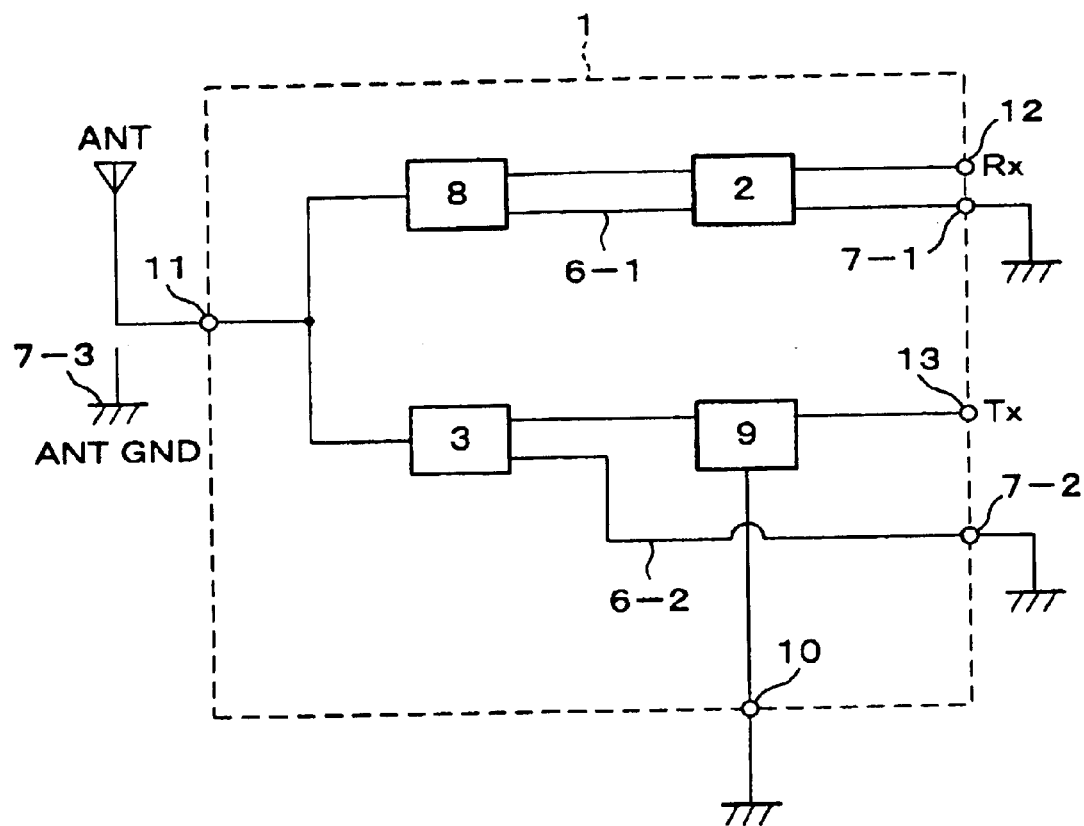
FIG. 2 is a schematic circuit diagram illustrating how the ground electrodes of the branching filter of the first preferred embodiment are connected.

In a branching filter according to a first preferred embodiment of the present invention, as shown in FIGS. 1 and 2, on a surface of a multilayer ceramic substrate 1, a receiving surface acoustic wave filter (hereinafter referred to as an "Rx SAW filter") 2 and a transmitting surface acoustic wave filter (hereinafter referred to as a "Tx SAW filter") 3 are secured by flip-chip bonding or other suitable process and are electrically connected to the multilayer ceramic substrate 1 with solder, gold bumps 5, or other suitable connection.

This branching filter preferably includes a sealing member 4, made of a resin, metal, or other suitable material, for entirely covering and hermetically sealing the Rx SAW filter 2 and the Tx SAW filter 3. The SAW filters 2 and 3 also provide a branching-filter portion having a branching-filter function.

Each of the SAW filters 2 and 3 has, on a piezoelectric substrate, one or a plurality of interdigital transducers (hereinafter simply referred to as an "IDT") and two reflectors that sandwich the IDT from two directions, i.e., that are arranged along the direction in which a surface acoustic wave (hereinafter simply referred to as a "SAW") propagates.

The IDT is preferably made of a metal thin-film containing aluminum or other suitable material, and defines a SAW converter. Specifically, the IDT converts an input electrical (AC) signal into SAW energy, causes the SAW to propagate over the piezoelectric substrate, and converts the propagated SAW into an electrical signal for output. The reflectors have a function of reflecting the propagated SAW back in the direction from which it propagated.

In such an IDT, the signal conversion characteristic and/or passband thereof can be set by adjusting the length and/or the width of each finger of the interdigital electrodes, the spacing between two adjacent fingers of each interdigital electrode, and/or the interdigital width, which represents the length of the interdigitated portions of opposing interdigital fingers when the interdigital electrodes are combined. In the reflectors, on the other hand, the reflection characteristic can be set by adjusting the width or spacing of the electrode fingers of each reflector.

On the multilayer ceramic substrate 1, an antenna terminal 11, an Rx terminal 12 for reception, and a Tx terminal 13 for transmission are arranged along the periphery of a surface opposite to the surface on which the Rx SAW filter 2 and the Tx SAW filter 3 are arranged.

In addition, the multilayer ceramic substrate 1 includes an inner ground layer 6-1 and an outer ground layer 6-2 which are provided separately from each other, with the inner ground layer 6-1 being connected to an Rx external ground terminal 7-1 and the outer ground layer 6-2 being connected to a Tx external ground terminal 7-2. The Rx external ground terminal 7-1 and the Tx external ground terminal 7-2 are connected to an external ground terminal 7-3 for an antenna (ANT), on a printed circuit board or other substrate on which the multilayer ceramic substrate 1 is mounted, i.e., at a location other than on the multilayer ceramic substrate 1.

In the branching filter, the multilayer ceramic substrate 1 preferably includes a matching element 8 for impedance matching between the antenna terminal 11 and the Rx SAW filter 2. The matching element 8 is configured with microstrip lines that define inductance elements, as described later.

Further, in the branching filter, the multilayer ceramic substrate 1 includes a low pass filter 9 between the Tx SAW filter 3 and the Tx terminal 13. The low pass filter 9 is constituted by LC elements and attenuates signals having frequencies that exceed the passband of the Tx SAW filter 3.

It is preferable that the low pass filter 9 be configured to have a ripple in the low pass filter characteristic such that the ripple is set to match the passband of the Tx SAW filter 3. With this arrangement, provision of the low pass filter 9 does not result in deterioration in the passband characteristic of the Tx SAW filter 3.

Figure 8A:
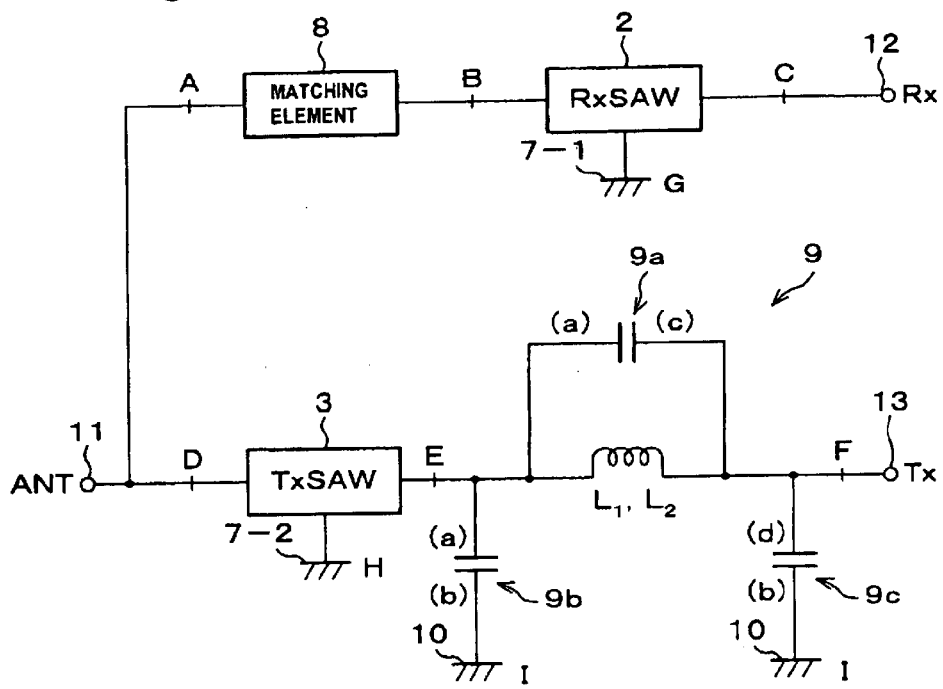
FIGS. 8A and 8B are circuit block diagrams of the branching filters according to preferred embodiments of the present invention, FIG. 8A showing a low pass filter of the first preferred embodiment of the present invention and FIG. 8B showing a low pass filter of a modification of the first preferred embodiment of the present invention.

The low pass filter 9 may be configured as the filter shown in FIG. 8A. That is, the low pass filter in FIG. 8A is a π-type circuit in which capacitance elements 9b and 9c are connected to corresponding opposite ends of series-connected inductance elements $L_1$ and $L_2$ and are also each connected to ground. In this low pass filter, another capacitance element 9a is connected in parallel with the series-connected inductance elements $L_1$ and $L_2$. It is to be noted that the π-type circuit is not limited to the third-order π-type circuit described above, and may be a fifth-order or sixth-order circuit.

Figure 8B:
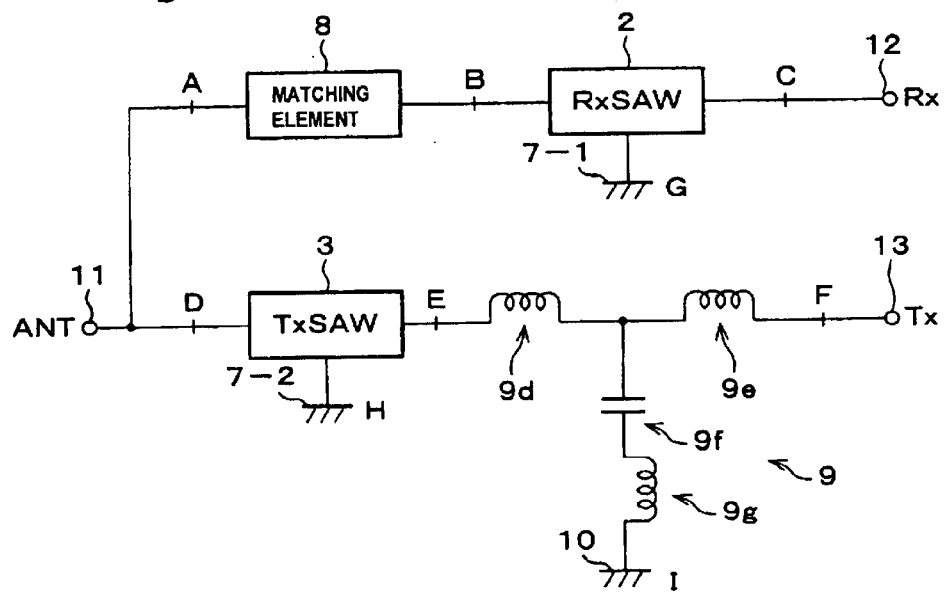

The low pass filter 9, however, is not limited to the configuration shown in FIG. 8A. For example, as shown in FIG. 8B, a low pass filter in the form of a T-type circuit may be used. In this low pass filter, a capacitance element 9f and an inductance element 9g are connected in series with each other, and one end of the series-connected elements 9f and 9g is connected between two inductance elements 9d and 9e that are connected in series with each other.

In the branching filter of preferred embodiments of the present invention, the ground of the low pass filter 9 is separated within the multilayer ceramic substrate 1 from the inner ground layers 6-1 and 6-2 of the other circuit elements, such as the Rx SAW filter 2, the Tx SAW filter 3, and the matching element 8. Further, the ground of the low pass filter 9 is connected to an external ground terminal 10, which is used only for the low pass filter 9 and is provided at the bottom section of the multilayer ceramic substrate 1 separately from the external ground terminals 7-1 and 7-2.

In FIG. 1, for convenience of illustration, while an example in which the transmitting SAW filter and the receiving SAW filter are provided separately is illustrated, the present invention is also applicable to a case in which the transmitting SAW filter and the receiving SAW filter are integrated into one chip.

Figure 3:
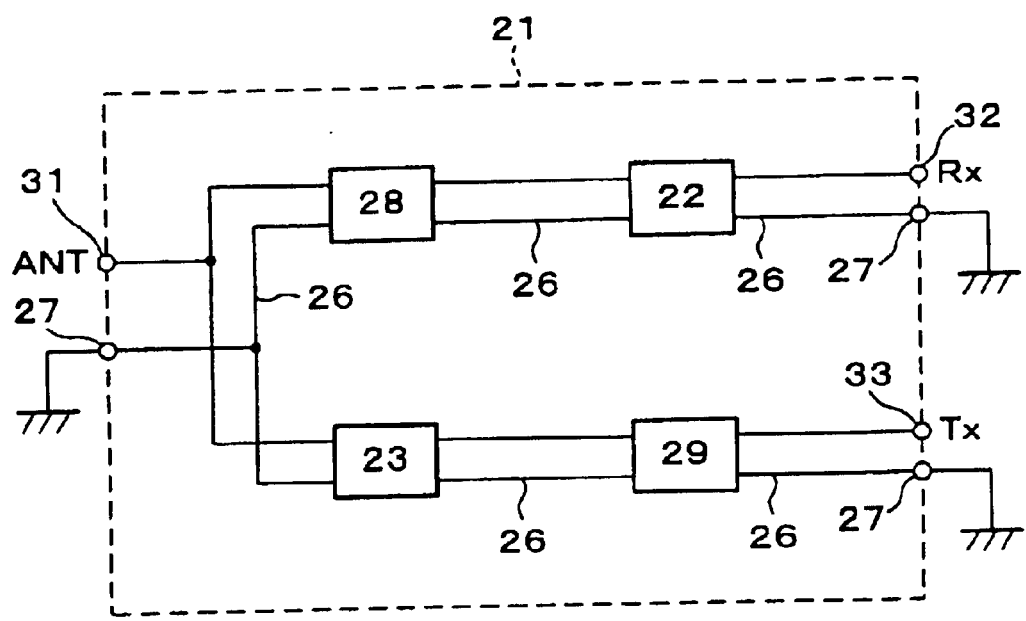
FIG. 3 is a schematic circuit diagram illustrating how the ground electrodes of a branching filter of the related art are connected.

FIG. 2 illustrates how the ground electrodes of the branching filter according to preferred embodiments of the present invention are connected, and FIG. 3 illustrates how the ground electrodes of a typical branching filter of the related art are connected. In the branching filter of the related art shown in FIG. 3, the grounds of SAW filters 22 and 23, a matching element 28, and a low pass filter 29 are connected to a ground layer 26 provided within a multilayer ceramic substrate 21, and the ground layer 26 is further connected to an external ground terminal 27 provided at the bottom of the multilayer ceramic substrate 21.

In contrast, according to preferred embodiments of the present invention, as shown in FIG. 2, the ground of the low pass filter 9 is provided separately from the grounds of the other circuit elements in the multilayer ceramic substrate 1, which defines a package. This can reduce the electrical interference between the ground of the low pass filter 9 and the other grounds, thereby allowing an improvement in transmitting-side spurious characteristic over the configuration of the related art.

Figure 4:
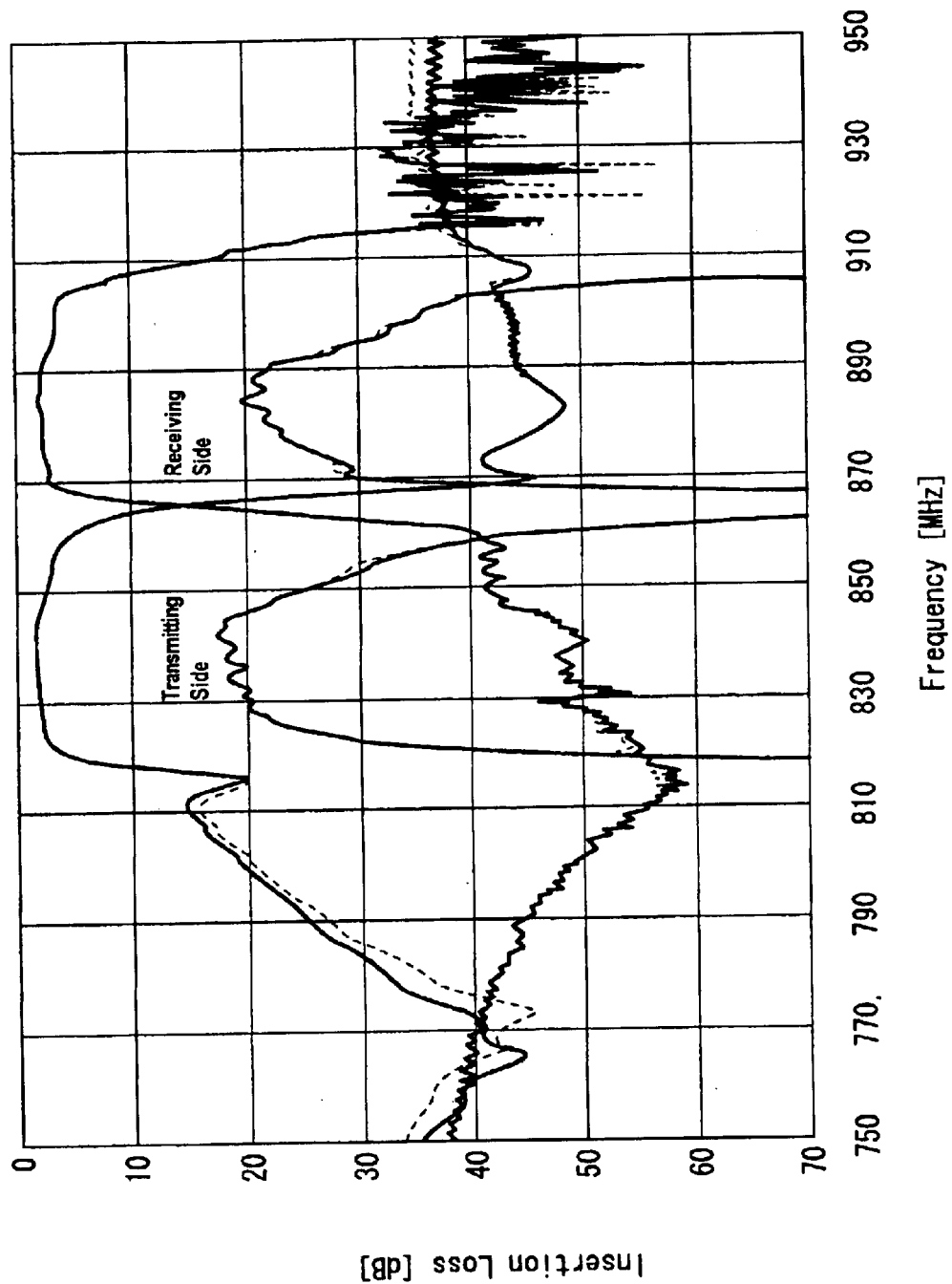
FIG. 4 is a graph showing the band characteristics of the branching filters of a preferred embodiment of the present invention and the branching filter of the related art.

FIG. 4 shows a result obtained by comparison between the insertion losses in the bands (a transmission band of 824 MHz to 849 MHz and a reception band of 869 MHz to 894 MHz) of the branching filter of preferred embodiments of the present invention and an example of a branching filter of the related art. In the figure, the solid line represents the branching filter of preferred embodiments of the present invention and the broken line represents the branching filter of the related art. It can be seen that the configuration of preferred embodiments of the present invention does not exhibit an in-band characteristic change, i.e., deterioration in the insertion loss and the corresponding attenuation in both the transmitting band (of the Tx SAW filter 3) and the receiving band (of the Rx SAW filter 2).

Figure 5:
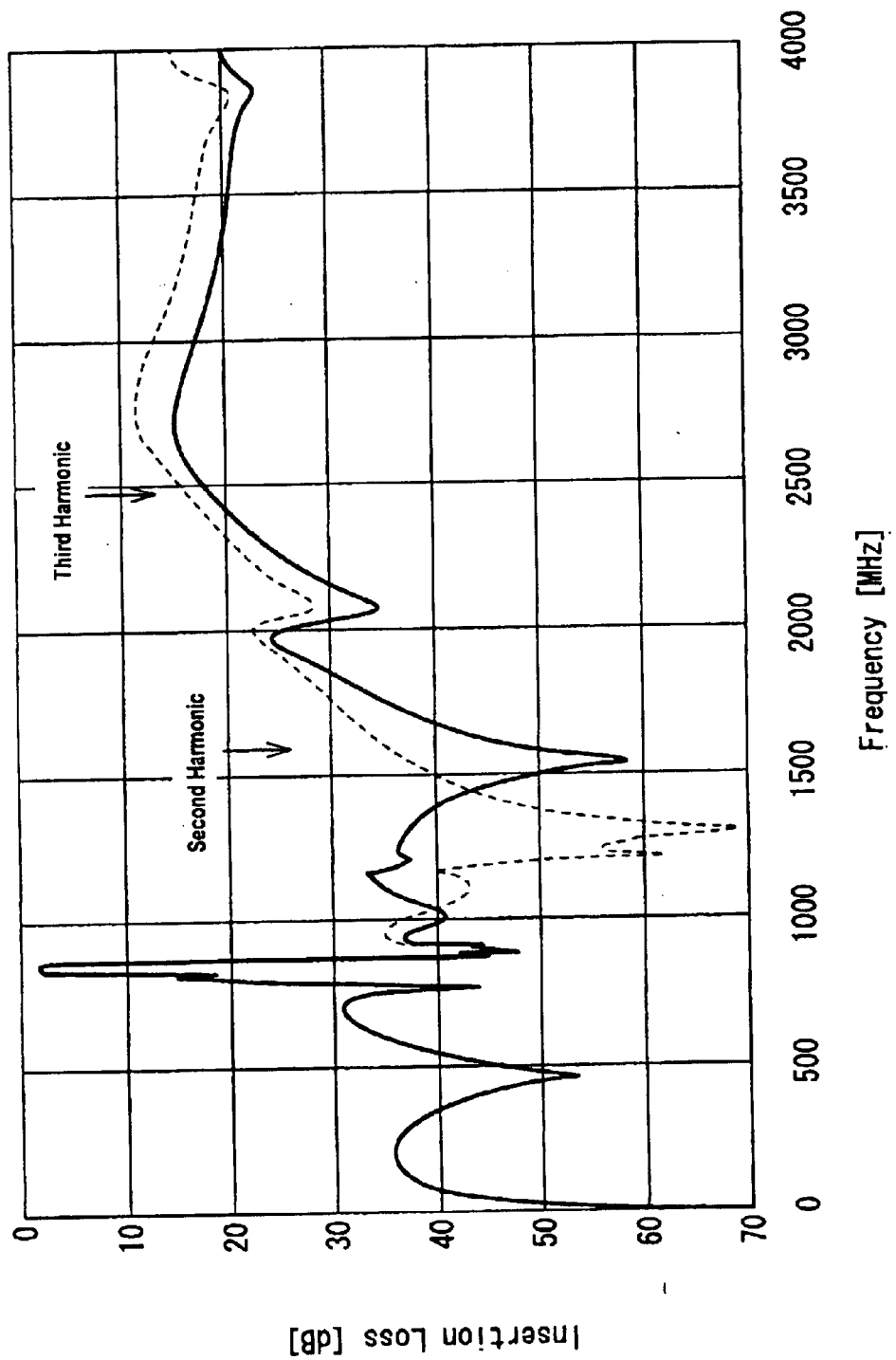
FIG. 5 is a graph showing the transmitting-side spurious characteristics of the branching filters of a preferred embodiment of the present invention and the related art.

FIG. 5 shows spurious characteristics in the transmitting bands of the branching filter of preferred embodiments of the present invention and the branching filter of the related art. In the figure, the solid line represents the branching filter of preferred embodiments of the present invention and the broken line represents the branching filter of the related art. In practice, a second harmonic (1,648 MHz to 1,698 MHz) and a third harmonic (2,472 MHz to 2,547 MHz) can cause a problem. As shown, the configuration of preferred embodiments of the present invention, however, can improve the spurious response in the second harmonic from 33 dB to 40 dB and can also improve the spurious response in the third harmonic from 15 dB to 18 dB. Those results show that preferred embodiments of the present invention significantly improve the spurious characteristics without affecting the transmitting and receiving bands of the branching filter.

Figure 6:
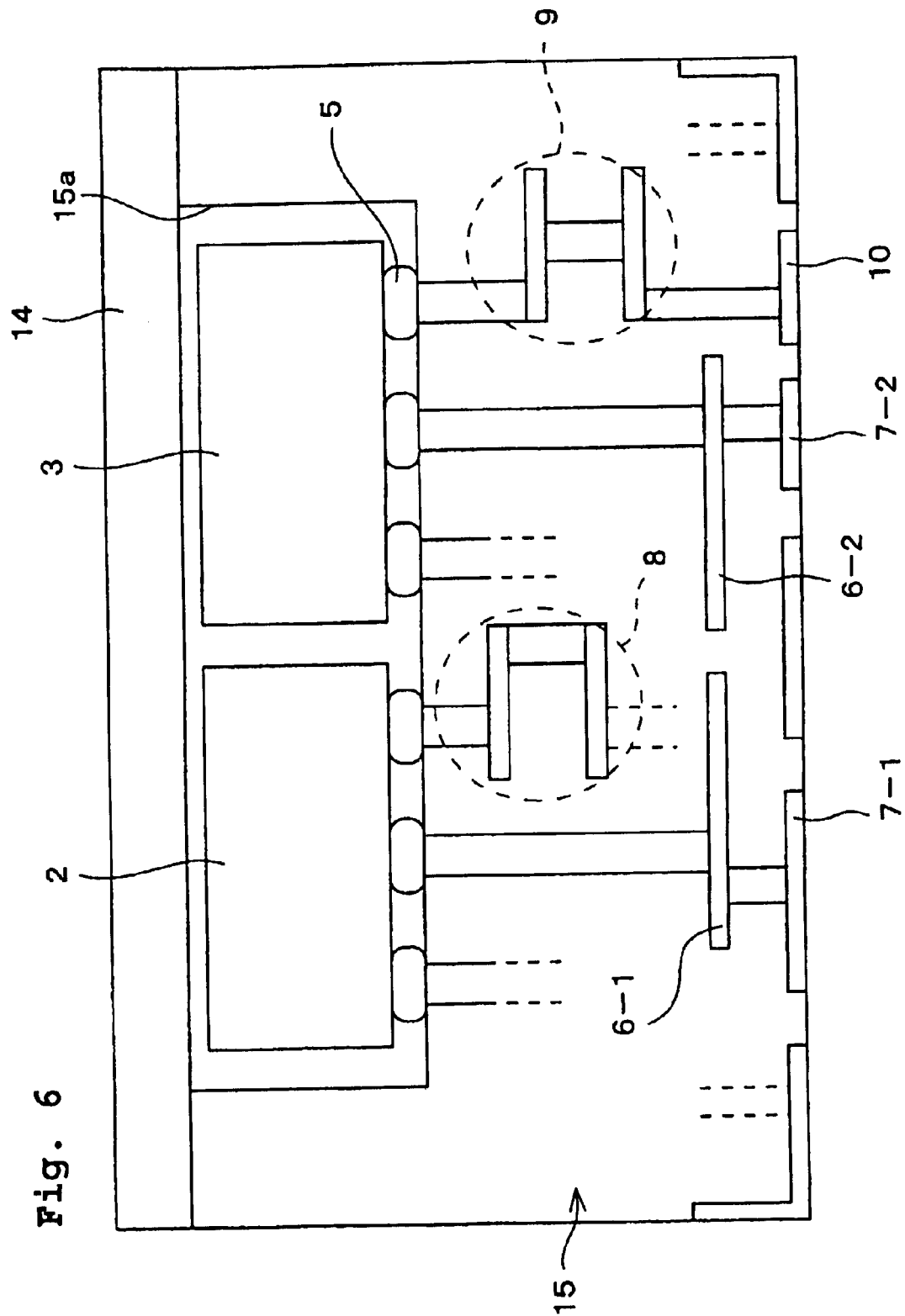
FIG. 6 is a schematic sectional view of a branching filter according to a second preferred embodiment of the present invention.
Figure 7:
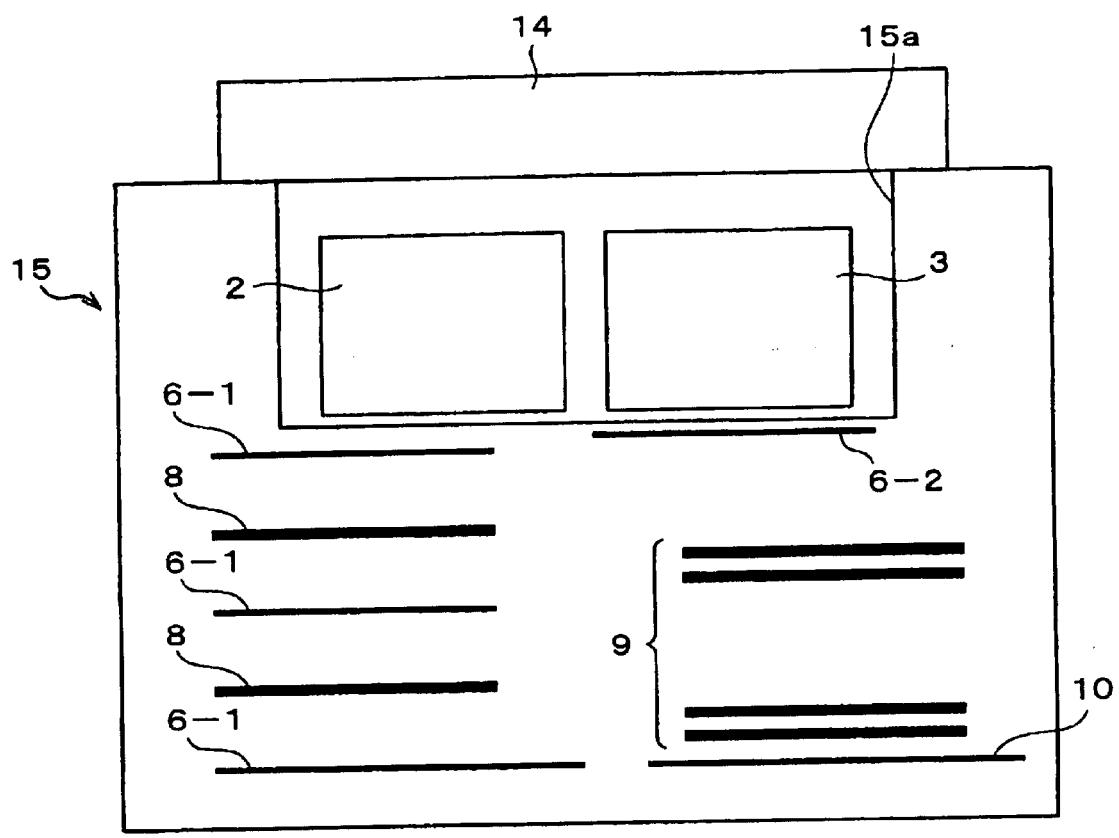
FIG. 7 is a schematic sectional view of a multilayer ceramic substrate of the branching filter of the second preferred embodiment of the present invention.

A branching filter according to a second preferred embodiment of the present invention will now be described. As shown in FIGS. 6 and 7, in the second preferred embodiment, a multilayer substrate 15 has a cavity 15a for accommodating the SAW filters 2 and 3. The SAW filters 2 and 3 are secured within the cavity 15a by flip-chip bonding or other suitable process, and are electrically connected to the multilayer ceramic substrate 15 with solder, gold bumps 5, or other suitable material. The SAW filters 2 and 3 are hermetically sealed within the cavity 15a by a lid 14. The other configurations of the branching filter of the second preferred embodiment are analogous to those of the first preferred embodiment, and the same reference numerals designate similar portions and similar elements, the descriptions of which are omitted.

The configuration of the second preferred embodiment of the present invention, in which the multilayer ceramic substrate 15 has the cavity 15a for accommodating the SAW filters 2 and 3, can also be applied to a case in which the SAW filters 2 and 3 are secured to the multilayer ceramic substrate 15 with an adhesive or other suitable material and are electrically connected thereto by wire bonding.

The multilayer ceramic substrates 1 and 15 will now be described. Since the multilayer ceramic substrates 1 and 15 have the same multilayer structure, a description will be given of only the multilayer ceramic substrate 1.

The multilayer ceramic substrate 1 has a low pass filter 9 having, for example, the configuration shown in FIG. 8A. Specifically, this low pass filter 9 includes the series-connected coils (inductance elements) $L_1$ and $L_2$, the capacitor (capacitance element) 9a that is connected in parallel with the coils $L_1$ and $L_2$, and the capacitors (capacitance elements) 9b and 9c each having one end connected to ground. The other end of the capacitor 9b is connected to a terminal, adjacent to the Tx SAW filter 3, of the coils $L_1$ and $L_2$. The other end of the capacitor 9c is connected to a terminal, adjacent to the Tx terminal 13, of the coils $L_1$ and $L_2$.

The multilayer ceramic substrate 1 has, in the thickness direction, for example, 12 layers, i.e., first to twelfth dielectric layers 1a to 1m, between which conductor layer patterns made of copper or tungsten are provided.

The dielectric layers 1a to 1m are each manufactured preferably by forming a conductor layer pattern on a surface of a substantially-rectangular green sheet, which is made of an insulating material, including a ceramic oxide, such as $Al_2O_3$, by printing or other suitable process. The resulting green sheets are then stacked on one another in the thickness direction and fired, thereby providing the multilayer substrate 1.

Via-holes provided in the dielectric layers 1a to 1m in the thickness direction of the stack thereof and side sections of the dielectric layers 1a to 1m provide electrical connections between the dielectric layers 1a to 1m. In this case, the number of layers of the multilayer ceramic substrate 1 may be changed depending on the shape and/or type of the matching element 8 and/or the low pass filter 9.

FIGS. 9 to 20 are plan views respectively illustrating the 12 dielectric layers 1a to 1m of the multilayer ceramic substrate 1, each layer having a conductor layer pattern different from each other.

Figure 9:
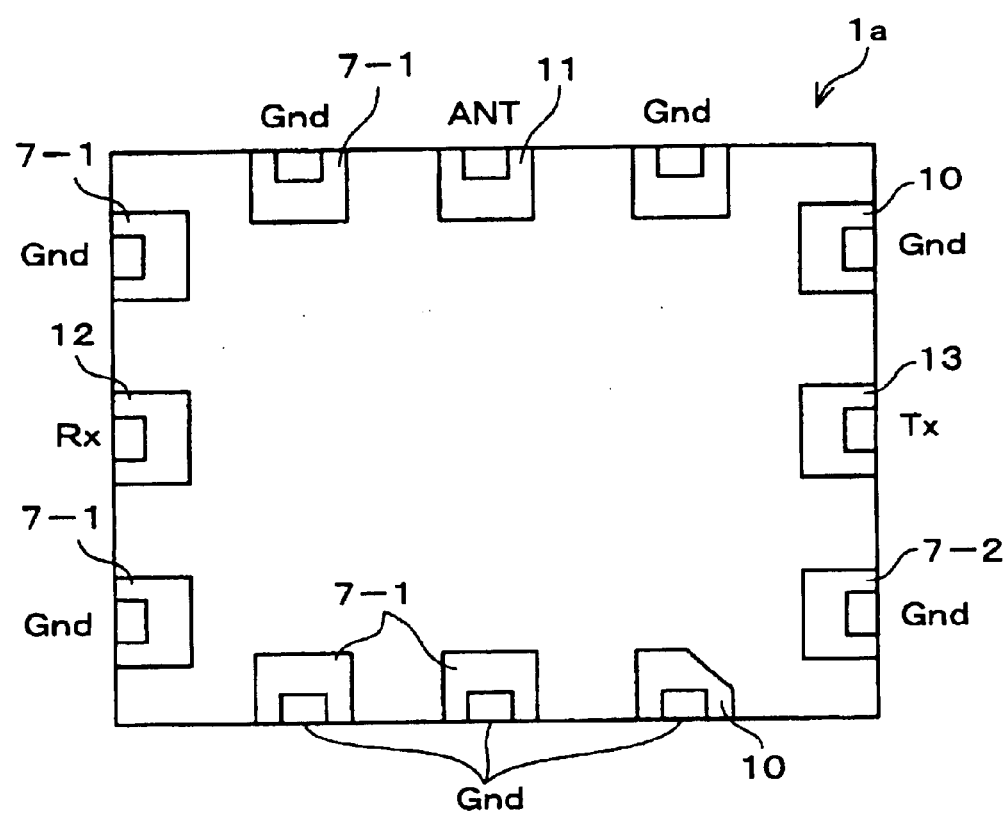
FIG. 9 is a plan view of a first dielectric layer of the multilayer ceramic substrate.

As shown in FIG. 9, the first dielectric layer 1a has, along the periphery thereof, the antenna terminal (ANT) 11, the Rx terminal 12, the Tx terminal 13, as well as the outer ground (Gnd) terminals 7-1, 7-2, and 10 provided therebetween.

The antenna (ANT) terminal 11 is provided at the approximate center of a long-side edge of the first dielectric layer 1a. The Rx terminal 12 is provided at the approximate center of a short-side edge of the first dielectric layer 1a. The Tx terminal 13 is provided at the approximate center of a short-side edge opposite to the edge at which the Rx terminal 12 is provided. The external ground terminals 10 for the low pass filter 9 are arranged adjacent to the Tx terminal 13.

Figure 10:
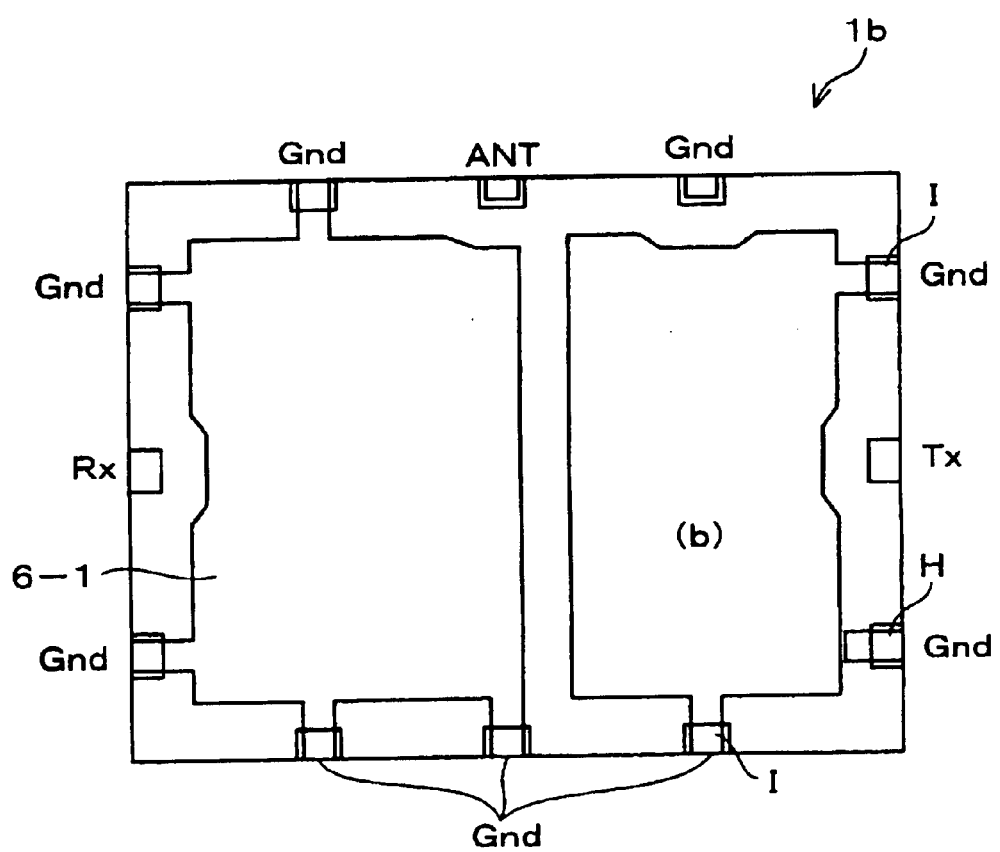
FIG. 10 is a plan view of a second dielectric layer of the multilayer ceramic substrate.

As shown in FIG. 10, the second dielectric layer 1b has, on about half the surface area thereof adjacent to the Tx terminal 13, an inner ground layer (b) for the capacitors 9b and 9c of the low pass filter 9. The inner ground layer (b) is connected to the external ground terminals 10 via corresponding contact points I. The second dielectric layer 1b has, in a region different from the inner ground layer (b), a first inner ground layer 6-1 for the Rx SAW filter 2 and the matching element 8. The first inner ground layer 6-1 is formed on about half the surface area of the second dielectric layer 1b.

Figure 11:
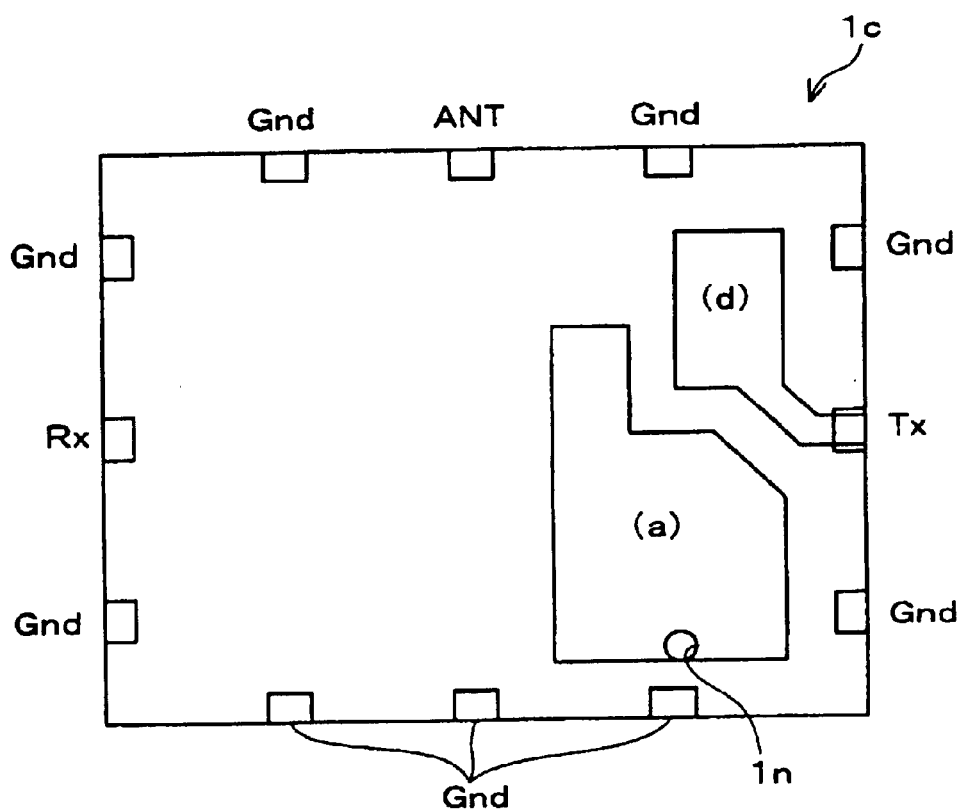
FIG. 11 is a plan view of a third dielectric layer of the multilayer ceramic substrate.

As shown in FIG. 11, the third dielectric filter 1c has, at a position facing the inner ground layer (b), an internal conductor layer (a) for the capacitor 9b and an internal conductor layer (d) for the capacitor 9c. The internal conductor layer (d) is connected to the Tx terminal 13, and the internal conductor layer (a) is connected to the Tx SAW filter 3 through a via-hole 1n.

Figure 12:
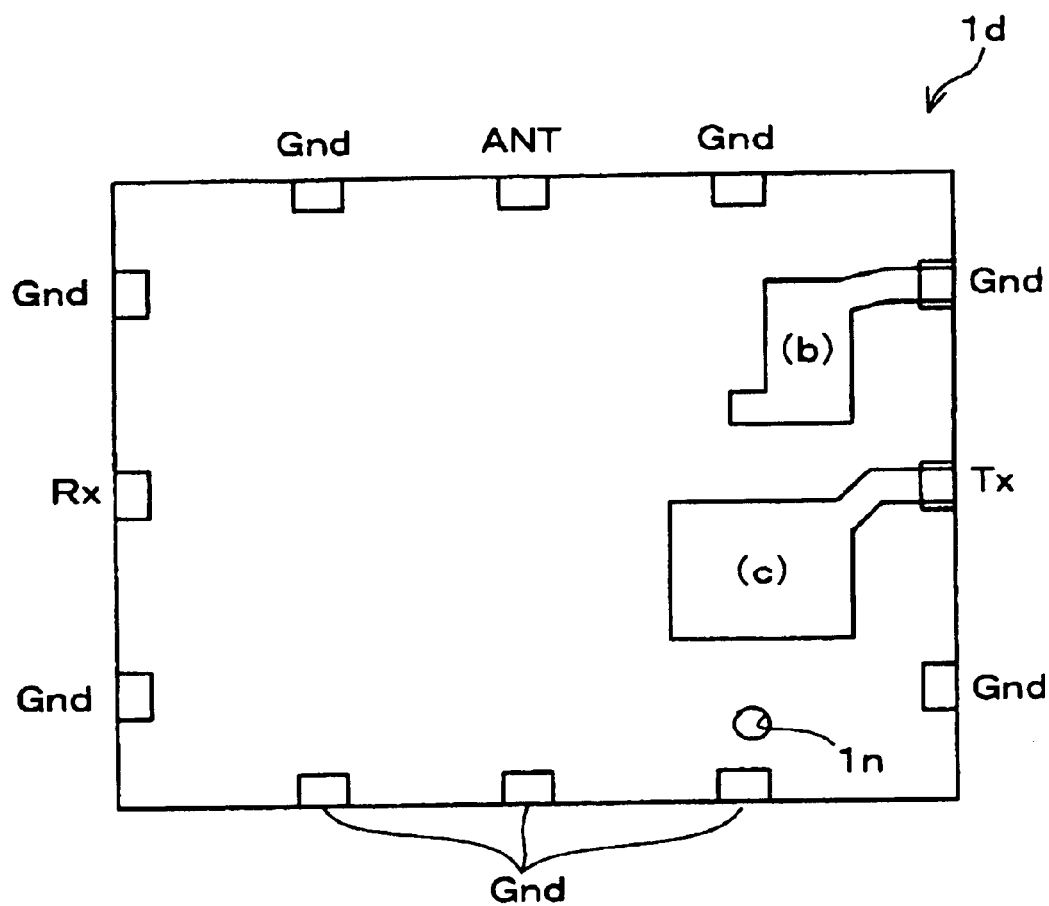
FIG. 12 is a plan view of a fourth dielectric layer of the multilayer ceramic substrate.

As shown in FIG. 12, the fourth dielectric layer 1d has another inner ground layer (b) at a position facing the internal conductor layer (d) and an internal conductor layer (c) at a position facing the internal conductor layer (a).

Figure 13:
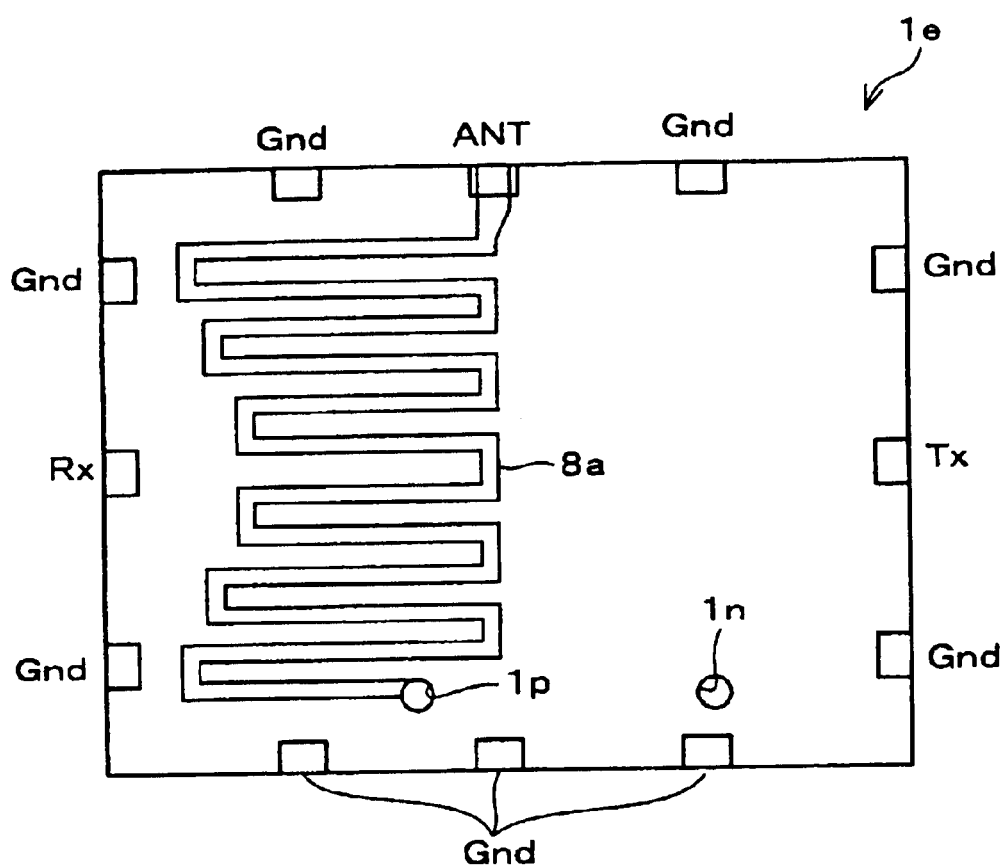
FIG. 13 is a plan view of a fifth dielectric layer of the multilayer ceramic substrate.

As shown in FIG. 13, the fifth dielectric layer 1e has, adjacent to the Rx terminal, a microstrip line 8a, which is a portion of the matching element 8. The microstrip line 8a is bent so as to secure enough line length. Thus, the microstrip line 8a is located in a region that is different from a region that faces the position at which the low pass filter 9 is located. One end of the microstrip line 8a is connected to the ANT terminal. The other end of the microstrip line 8a is connected through a via-hole 1p to a microstrip line 8b of another layer, i.e., the layer 1i, which will be described later.

Figure 14:
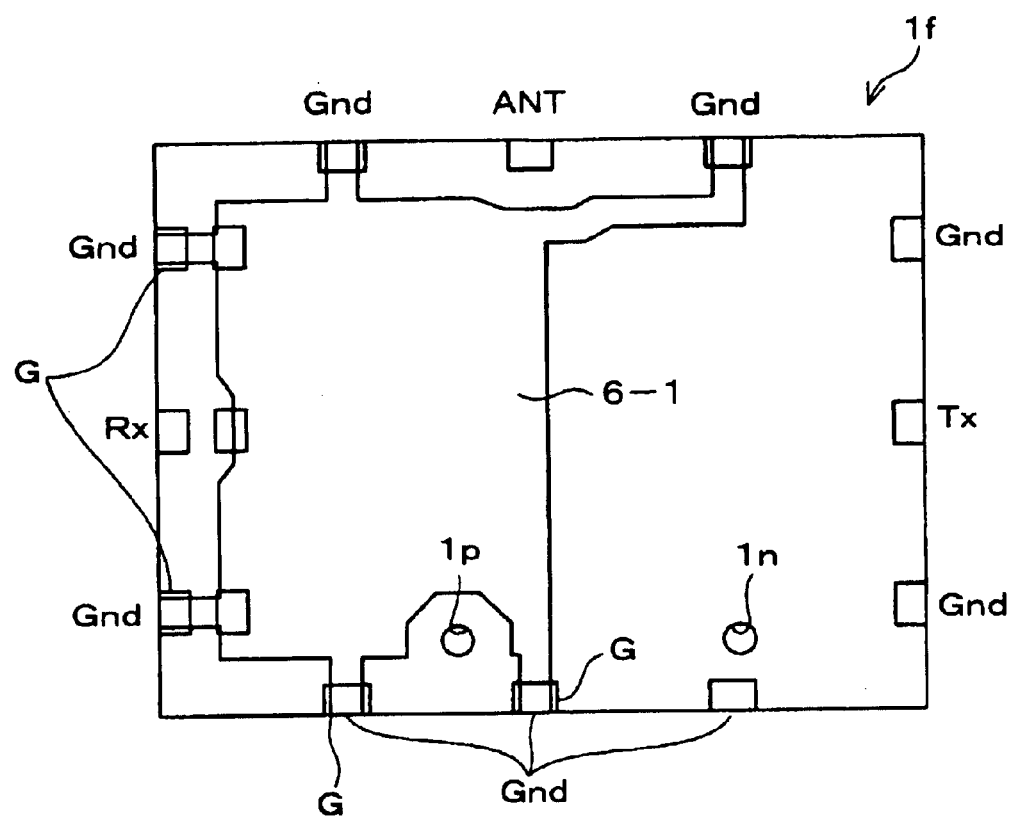
FIG. 14 is a plan view of a sixth dielectric layer of the multilayer ceramic substrate.

As shown in FIG. 14, the sixth dielectric layer 1f has a second inner ground layer 6-1 at a location facing the first inner ground layer 6-1 of the second dielectric layer 1b. Thus, the microstrip line 8a previously described is sandwiched by the first inner ground layer 6-1 and the second inner ground layer 6-1 in the thickness direction of the multilayer ceramic substrate 1.

Figure 15:
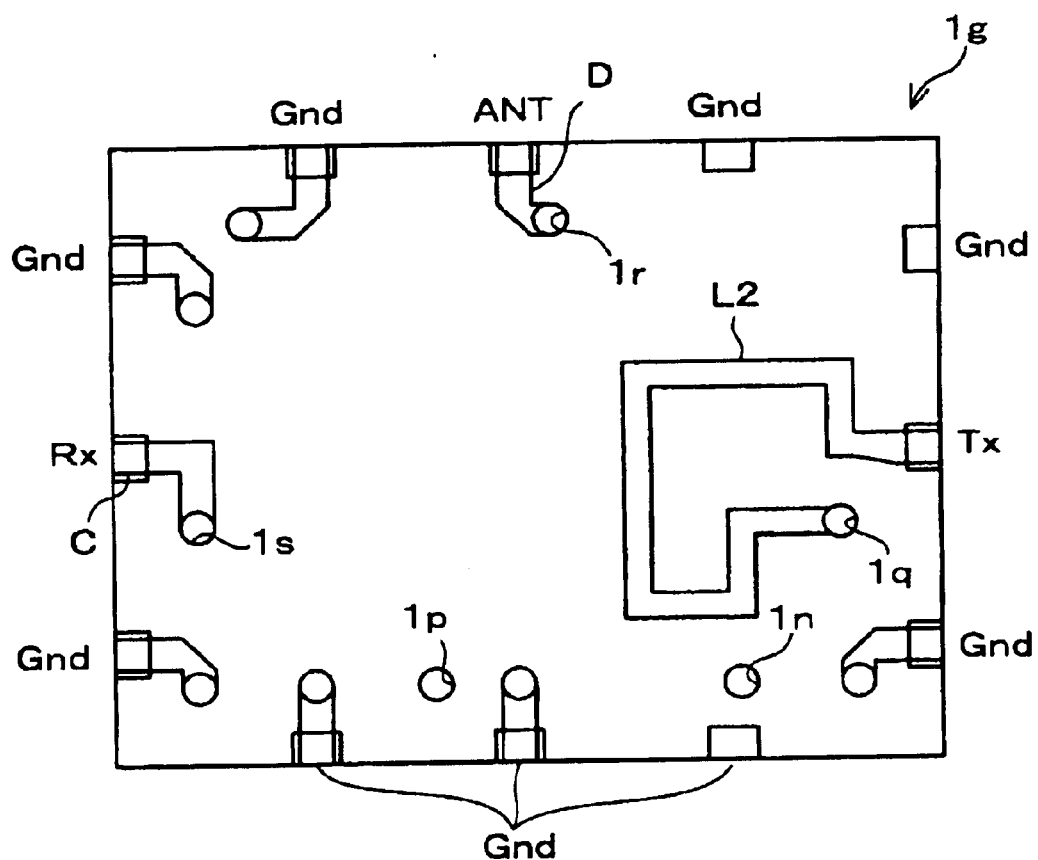
FIG. 15 is a plan view of a seventh dielectric layer of the multilayer ceramic substrate.

As shown in FIG. 15, the seventh dielectric layer 1g has the above-noted coil $L_2$ adjacent to the Tx terminal. The coil $L_2$ is provided within a surface region facing the position at which the inner ground layer (b) of the second dielectric layer 1b is located. One end of the coil $L_2$ is connected to the TX terminal, and the other end thereof is connected through a via-hole 1q to the coil $L_1$ of another layer, i.e., the eighth dielectric layer 1h, which will be described below.

Figure 16:
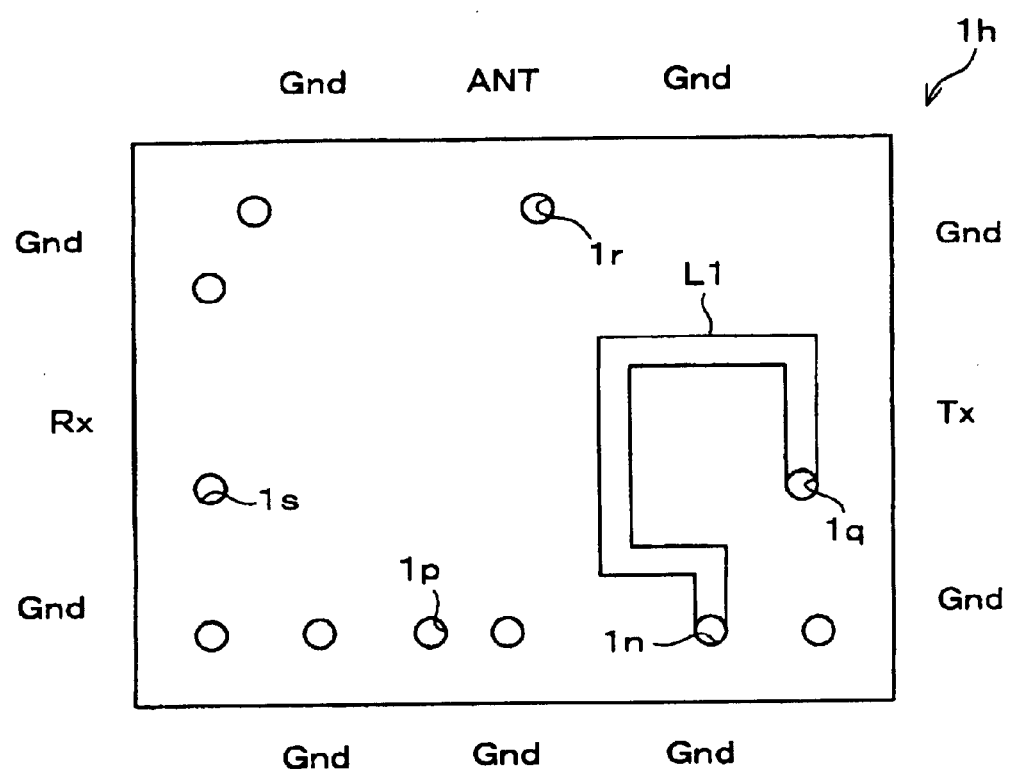
FIG. 16 is a plan view of an eighth dielectric layer of the multilayer ceramic substrate.

As shown in FIG. 16, the eighth dielectric layer 1h has the coil $L_1$, which is arranged so as to wind along the position at which the coil $L_2$ is provided. One end of the coil $L_1$ is connected to the coil $L_2$ through the via-hole 1q, and the other end thereof is connected to the input of the Tx SAW filter 3 through the via-hole 1n.

Figure 17:
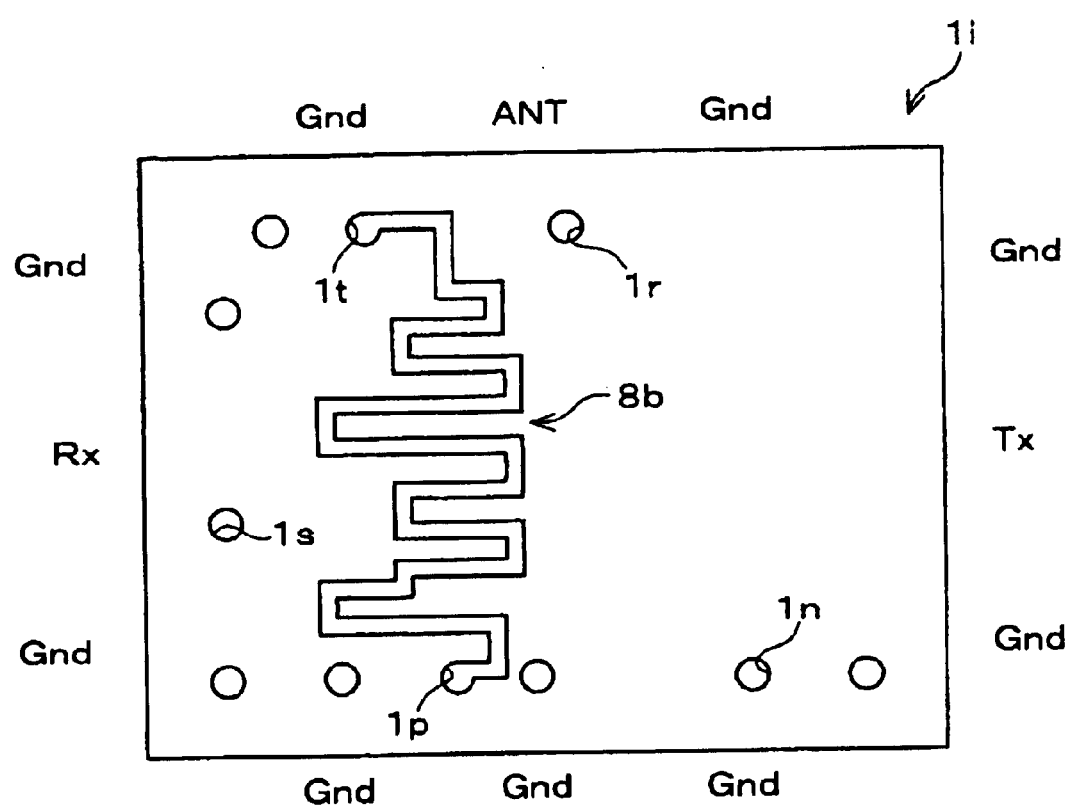
FIG. 17 is a plan view of a ninth dielectric layer of the multilayer ceramic substrate.

As shown in FIG. 17, the ninth dielectric layer 1i has another microstrip 8b of the matching element 8 at a position facing the microstrip line 8a. One end of the microstrip line 8b is connected to the microstrip line 8a through the via-hole 1p, and the other end thereof is connected to the input of the Rx SAW filter 2 through a via-hole 1t.

Figure 18:
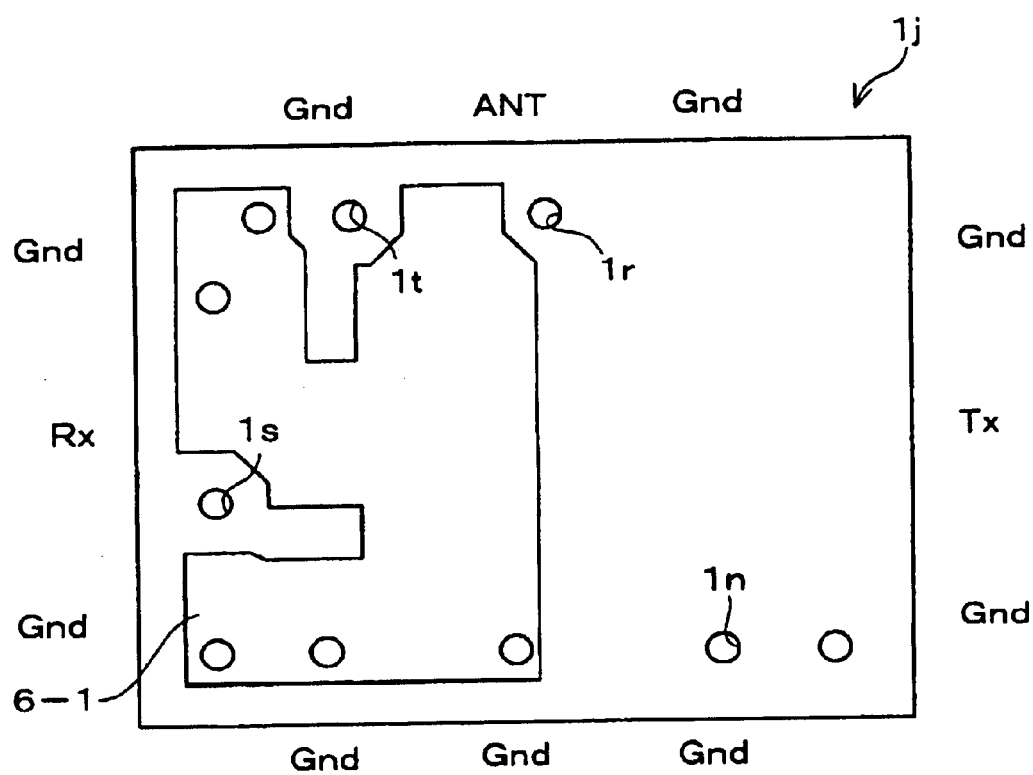
FIG. 18 is a plan view of a tenth dielectric layer of the multilayer ceramic substrate.

As shown in FIG. 18, the tenth dielectric layer 1j has a third inner ground layer 6-1 adjacent to the Rx terminal. This third inner ground layer 6-1 of the tenth dielectric layer 1j and the second inner ground layer 6-1 of the sixth dielectric layer 1f sandwich the above-noted microstrip line 8b in the thickness direction of the multilayer ceramic substrate 1.

Figure 19:
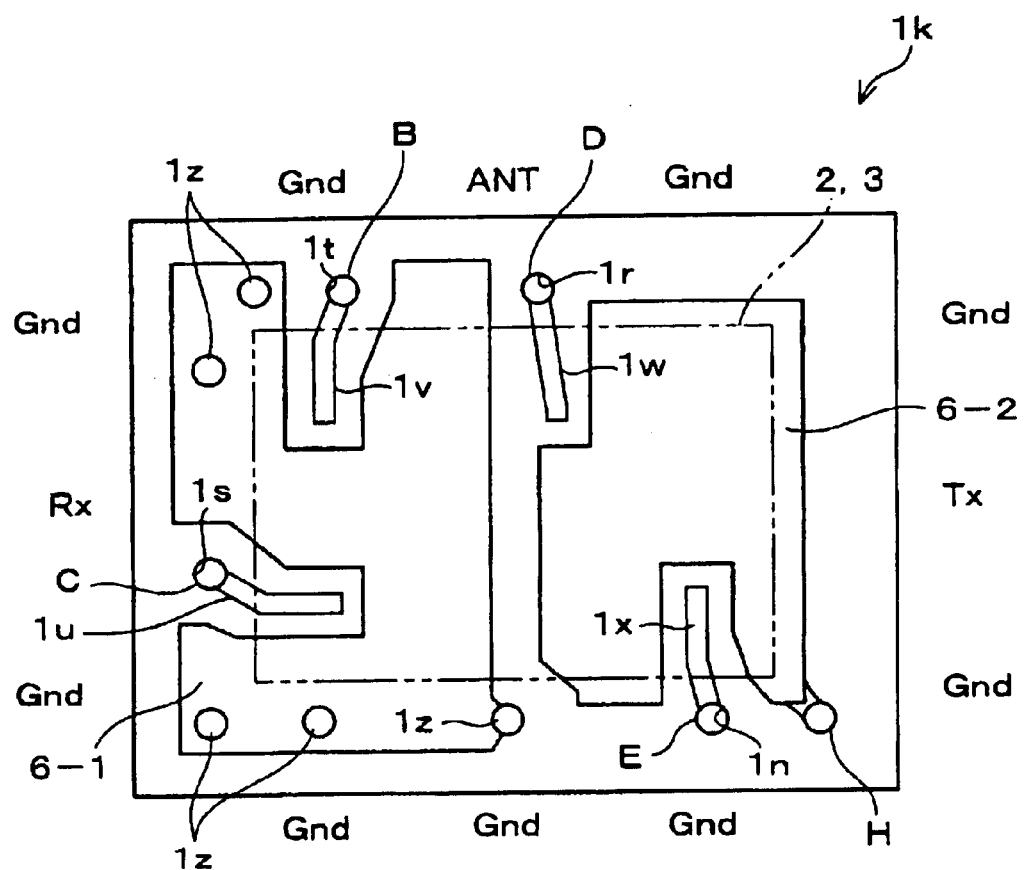
FIG. 19 is a plan view of an eleventh dielectric layer of the multilayer ceramic substrate.

As shown in FIG. 19, the eleventh dielectric layer 1k has an output line 1u for the Rx SAW filter 2. One end of the output line 1u is connected to the output terminal of the Rx SAW filter 2 and the other end thereof is connected to a via-hole 1s. An input line 1v for the Rx SAW filter 2 is connected at one end to the input terminal of the Rx SAW filter 2, and the other end thereof is connected to the via-hole 1t.

An output line 1w for the Tx SAW filter 3 is connected at one end to the output terminal of the Tx SAW filter 3, and the other end thereof is connected to a via-hole 1r. An input line 1x for the Tx SAW filter 3 is connected at one end to the input terminal of the Tx SAW filter 3, and the other end thereof is connected to the via-hole 1n.

Figure 20:
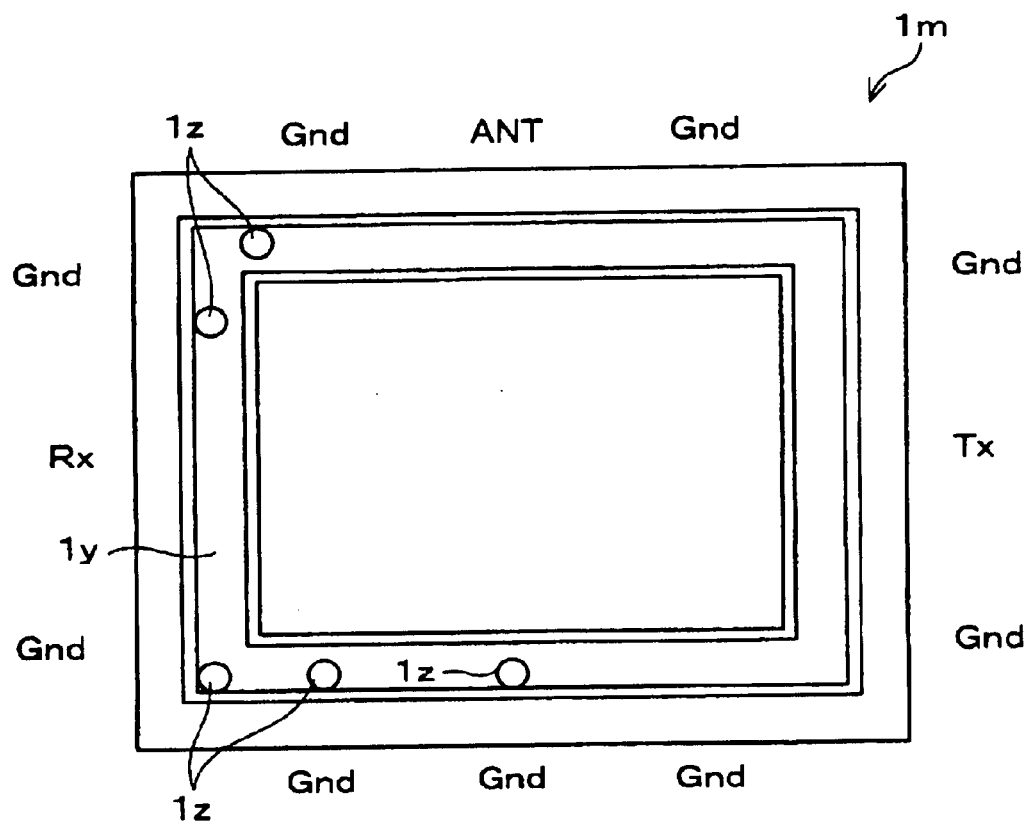
FIG. 20 is a plan view of a twelfth dielectric layer of the multilayer ceramic substrate.

As shown in FIG. 20, the twelfth dielectric layer 1m has a shield ring 1y, disposed along the periphery of the multilayer ceramic substrate 1, for preventing electromagnetic interference between the Rx SAW filter 2 and the Tx SAW filter 3. The shield ring 1y is connected to the third inner ground layer 6-1, which is disposed at the eleventh dielectric layer 1k, through via-holes 1z.

In this manner, the matching element 8 and the low pass filter 9 are provided at positions at which they do not face each other in the thickness direction. As a result, this arrangement further improves the advantage obtained by isolating the ground of the low pass filter 9 and the grounds of the other elements within the multilayer ceramic substrate 1 defining a package.

In addition, the matching element 8 and the low pass filter 9 are provided at layers that are different from each other. This arrangement also improves the advantage obtained by isolating the ground of the low pass filter 9 and the grounds of the other elements within the multilayer ceramic substrate 1 defining a package. The low pass filter 9 is configured using both the inductance elements and the capacitance elements, but can also be configured using either type of the elements.

Figure 21:
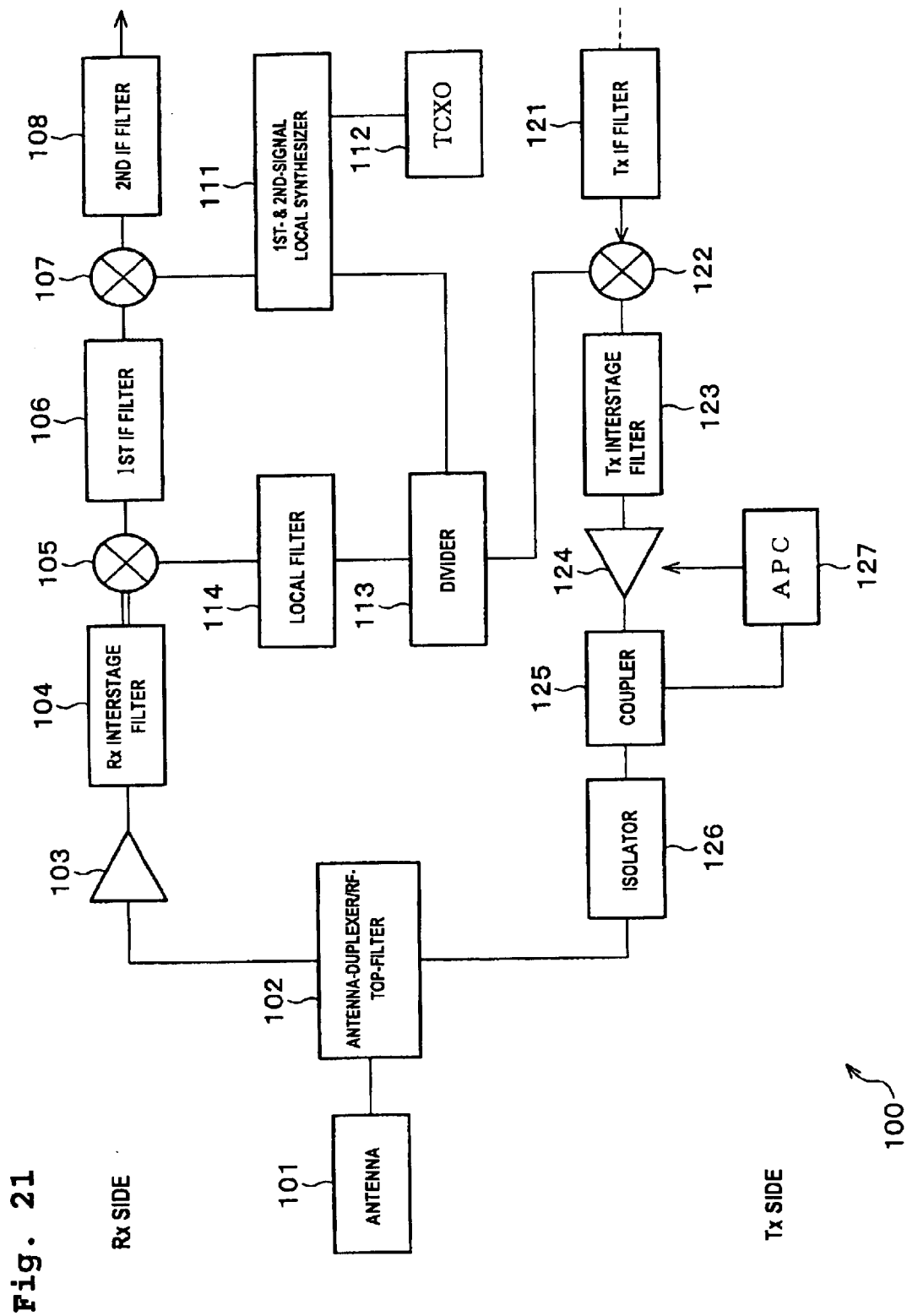
FIG. 21 is a circuit block diagram showing a major portion of a communication apparatus according to a preferred embodiment of the present invention.

A communication apparatus 100 including the branching filter of various preferred embodiments of the present invention will now be described with reference to FIG. 12. The communication device 100 has a receiver (Rx side) for reception and a transmitter (Tx side) for transmission. The receiver includes an antenna 101, an antenna-duplexer/RF-top-filter 102, an amplifier 103, an Rx interstage filter 104, a mixer 105, a first IF filter 106, a mixer 107, a second IF filter 108, a first- and second-signal local synthesizer 111, a TCXO (temperature compensated crystal oscillator) 112, a divider 113, and a local filter 114. It is preferable that the Rx interstage filter 104 sends balanced signals to the mixer 105, as indicated by double lines in FIG. 21, to secure the stability thereof.

The transmitter (Tx side) of the communication apparatus 100 shares the antenna 101 and the antenna-duplexer/RF-top-filter 102 with the receiver described above, and further includes a Tx IF filter 121, a mixer 122, a Tx interstage filter 123, an amplifier 124, a coupler 125, an isolator 126, and an APC (automatic power control) 127.

The branching filter according to any one of the preferred embodiments described above is advantageously applicable to the antenna-duplexer/RF-top-filter 102.

Accordingly, since the branching filter of preferred embodiments of the present invention is more multifunctional and miniaturized as well as having an improved transmission characteristic, the communication apparatus incorporating the branching filter of preferred embodiments of the present invention reliably achieves an improved transmitting/receiving function and a reduction in size.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A branching filter comprising:
   a receiving surface acoustic wave filter;
   a transmitting surface acoustic wave filter;
   at least one matching element connected to the receiving surface acoustic wave filter; and
   a filter having at least one of an inductance element and a capacitance element, said filter being connected to the transmitting surface acoustic wave filter;
   wherein the ground of said filter is provided separately from the grounds of the receiving surface acoustic wave filter, the transmitting surface acoustic filter, and said at least one matching element.

2. The branching filter according to claim 1, wherein said filter is a low pass filter comprising a π-type circuit including capacitance elements which are connected to corresponding opposite ends of inductance elements, said inductance elements are connected in series with each other, and said capacitance elements are each connected to ground, and another capacitance element is connected in parallel with the inductance elements.

3. The branching filter according to claim 2, wherein the π-type circuit is one of a third-order πtype circuit, a fifth-order π-type circuit and a sixth-order π-type circuit.

4. The branching filter according to claim 1, further comprising a ceramic substrate, wherein said receiving surface acoustic wave filter and said transmitting surface acoustic wave filter are provided on said ceramic substrate.

5. The branching filter according to claim 4, wherein the ceramic substrate has a multilayer structure.

6. The branching filter according to claim 5, wherein said filter is provided within the multilayer ceramic substrate.

7. The branching filter according to claim 5, wherein the ceramic substrate having the multilayer structure includes a cavity for accommodating the receiving surface acoustic wave filter and the transmitting surface acoustic filter.

8. The branching filter according to claim 1, further comprising a sealing member arranged to seal the receiving surface acoustic wave filter and the transmitting surface acoustic wave filter.

9. The branching filter according to claim 1, wherein the at least one matching element includes a plurality of microstrip lines that define inductance elements.

10. The branching filter according to claim 1, wherein said filter is a low pass filter having a ripple in the low pass filter characteristic thereof such that the ripple matches the passband of the transmitting surface acoustic wave filter.

11. The branching filter according to claim 1, wherein said filter is a low pass filter including two inductance elements that are connected in series with each other, a series circuit in which a capacitance element and an inductance element are connected in series with each other, and one end of the series circuit is connected between the two inductance elements.

12. The branching filter according to claim 11, wherein said low pass filter is defined by a T-type circuit.

13. The branching filter according to claim 1, further comprising an external ground terminal that is separate from the grounds of the receiving surface acoustic wave filter, the transmitting surface acoustic filter and the at least one matching element, wherein a ground of said filter is connected to said external ground terminal.

14. The branching lifter according to claim 1, wherein the ground of said receiving surface acoustic wave filter and the ground of said transmitting surface acoustic wave filter are separated from each other.

15. A communication apparatus comprising the branching filter according to claim 1.

* * * * *